United States Patent [19]

Colandrea et al.

[11] Patent Number: 5,747,975

[45] Date of Patent: May 5, 1998

[54] OVERLOAD PROTECTION CIRCUIT FOR MOS POWER DRIVERS

[75] Inventors: Francesco Colandrea, Segrate; Vanni Poletto, Casale Monferrato, both of Italy

[73] Assignee: SGS-Thomson Microelectronics S.r.l., Agrate Brianza, Italy

[21] Appl. No.: 408,014

[22] Filed: Mar. 21, 1995

[30] Foreign Application Priority Data

Mar. 22, 1994 [EP] European Pat. Off. ............. 94830125

[51] Int. Cl.⁶ ........................... G05F 1/569; H02H 7/00
[52] U.S. Cl. .................................. 323/276; 361/18
[58] Field of Search ........................ 323/273, 274, 323/275, 276, 277, 282, 284, 285; 361/18, 79, 86, 87, 88, 91, 93; 327/535, 538, 545, 546

[56] References Cited

U.S. PATENT DOCUMENTS

| | | | |
|---|---|---|---|
| 4,785,207 | 11/1988 | Eng | 327/524 |
| 4,808,839 | 2/1989 | Dunn et al. | 327/546 |
| 4,809,122 | 2/1989 | Fitzner | 361/18 |
| 4,972,136 | 11/1990 | Banura | 323/275 |
| 5,172,018 | 12/1992 | Colandrea et al. | 327/538 |
| 5,282,107 | 1/1994 | Balakrishnan | 361/18 |
| 5,499,152 | 3/1996 | Tamakoshi | 361/91 |

FOREIGN PATENT DOCUMENTS

| | | | |
|---|---|---|---|
| A-0 493 185 | 7/1992 | European Pat. Off. | H03K 17/16 |
| A-0 529 605 | 3/1993 | European Pat. Off. | H02H 9/02 |
| A-2 152 305 | 7/1985 | United Kingdom | H02H 3/08 |

OTHER PUBLICATIONS

European Search Report from European Patent Application No. 94830125.4, filed Mar. 22, 1994.

Patent Abstracts of Japan, vol. 14, No. 533 (E-1005) Nov. 22, 1990 & JP-A-02 224 521 Mitsubishi Electric Corporation.

*Primary Examiner*—Matthew V. Nguyen
*Attorney, Agent, or Firm*—Wolf, Greenfield & Sacks, P.C.; James H. Morris

[57] ABSTRACT

The circuit includes two regulating loops connected in parallel to each other. A slow regulating loop presents a lower first intervention threshold, and a fast regulating loop has a higher second intervention threshold. The slow regulating loop is low-gain and frequency-stable for accurately controlling the maximum value of the current supplied by the driver in the event of slow overloads or transient states. In the event of rapid overloads, the current supply increases rapidly and the fast regulating loop is turned on to rapidly discharge the parasitic capacitance of the driver.

29 Claims, 1 Drawing Sheet

1

OVERLOAD PROTECTION CIRCUIT FOR MOS POWER DRIVERS

BACKGROUND OF THE INVENTION

1. Field of the Invention

The present invention relates to an overload protection circuit for MOS power drivers, in particular NMOS and DMOS transistor high-side drivers.

2. Discussion of the Related Art

As is known, high-side power devices are interposed between the load and supply, and are formed by an N-channel MOS transistor (e.g. enhancement MOSFET or DMOS) with the drain terminal connected to the positive supply, one terminal of the load is connected to the source terminal of the transistor, and the other load terminal is grounded. Such an arrangement is shown in FIG. 1 in which 1 indicates the power transistor, 2 the load, and D, G, S the drain, gate and source terminals respectively.

To achieve maximum power at the load, the power transistor must operate in a linear region (like a resistor), i.e. the voltage $V_{GS}$ between the gate and source terminals must be higher than the voltage $V_{DS}$ between the drain and source terminals plus a threshold voltage $V_{TH}$. That is:

$$V_{GS} > V_{DS} + V_{TH} \text{ or}$$

$$V_G > V_D + V_{TH}$$

$$V_G > V_{CC} + V_{TH}$$

where $V_G$ and $V_D$ respectively represent the gate and drain terminal voltages with respect to ground, and $V_{CC}$ is the supply voltage.

In other words, the gate voltage $V_G$ must be higher than the supply voltage. To achieve the highest possible voltage at the load and hence a minimum voltage drop at the power transistor (and minimum power dissipation by the transistor), voltage $V_G$ must be considerably higher than supply voltage $V_{CC}$. The gate voltage of currently used integrated circuits is normally required to be roughly 10 V higher than the supply voltage, which higher voltage is normally supplied by so-called booster or charge pump circuits.

Numerous applications also require that the power outputs of the integrated circuit be provided with current limiting devices to safeguard the output transistor against overloading. A typical arrangement is shown in FIG. 2 which shows a MOS drive transistor 1, load 2, and a regulating loop 3 comprising a current and/or voltage detecting element (sensing resistor 4) and a regulating element 5 with a threshold (represented in this case by a voltage source 6). The output of the regulating element is connected to the gate terminal of transistor 1. The dotted line in FIG. 2 indicates the parasitic capacitance $C_{GS}$ between the source and gate regions of transistor 1. Regulating loop 3 controls current flow through drive transistor 1 and, when the current exceeds the predetermined threshold, begins drawing current $I_1$ to reduce voltage $V_{GS}$ of transistor 1 and so regulate the operating point and the current supplied by transistor 1.

In the case of small MOS power transistors (with a current flow of a few tens of mA), the regulating element consists of a high-gain operational amplifier capable of responding rapidly to fast transient states at the load.

In the case of medium or large –MOS power transistors (with output currents ranging between a few tens of mA and several Amps), the regulating element cannot consist of a low-impedance-output operational amplifier, due to the high parasitic capacitance $C_{GS}$ typical of MOS transistors resulting in frequency instability of the regulating loop. Consequently, circuits operating with fairly low bias currents and limited gain are employed to ensure frequency stability of the regulating loop (capacitance $C_{GS}$ is used directly as a compensating capacitance, and is located at a high-impedance point). Nevertheless, the stability obtainable becomes increasingly critical as the load driven by the power transistor approximates a short-circuit. The load resistance in fact enters directly into the equation determining the dominant pole of the loop transfer function (loop gain) of the regulating circuit.

As such, current I for reducing voltage $V_{GS}$ in the event of an overload is limited (at most a few tens of µA in the case of very large MOS transistors).

In the case of a rapid overload at the output (e.g. a mechanical overload during low-inductance operation, typically with very short wiring close to the output pin of the integrated circuit, as in the case of a load supply wire shorting with a considerable mass of metal such as the bodywork of a vehicle), the output current increases extremely rapidly.

In such a situation, voltage $V_{GS}$ must be reduced rapidly to bring the MOS transistor to the saturation region according to the statement:

$$V_{GS} < V_{DS} + V_{TH}$$

that is:

$$V_G < V_{CC} + V_{TH}$$

in which the transistor operates as a current source controlled by voltage $V_{GS}$, i.e. $I_D = f(V_{GS})$, where $I_D$ is the current through transistor 1. In fact, only alongside saturation operation of transistor 1 does the regulator operate as a linear regulator; and before the transistor reaches such a condition, the output current increases uncontrollably.

To bring about the above condition, the parasitic capacitance $C_{GS}$ between the gate and source terminals must therefore be discharged from a value of roughly $V_{CC} + V_{TH} + 10V$ to a value ranging between 0 V and $V_{cc} + V_{TH}$, depending on the value of the load. More specifically, in the case of an overload nearing ideal short-circuiting (very low resistance), the voltage at the gate terminal must be reduced by roughly $V_{CC} + 10V$.

Since, for a capacitor of capacitance C supplied with current I:

$$I/C = dV/dT$$

where dV is the voltage variation within time dT, in the present case this gives:

$$I_1/C_{GS} = dV_{GS}/dT$$

and therefore $$dT = dV_{GS} * C_{GS}/I_1$$

For typical values of $I_1 = 20$ µA, $C_{GS} = 400$ pF and $dV_{GS} = 15$ V, dT=300 µs.

For larger transistors (higher $C_{GS}$ times in excess of a millisecond are obtained.

This means that, within time interval dT, the output current may reach extremely high values limited solely by the resistance of the transistor and wiring, and normally resulting in damage to the driver.

The standard practice for protecting power devices of the type in question is to turn off the power stage when the current supplied by it exceeds a given threshold. The driver remains off and can only be turned on again by external intervention at the control input. To this end, various solutions have been proposed based on measuring the voltage drop at the power transistor in addition to the output current, to determine the product and limit the total power dissipated by the transistor.

Such solutions however cannot be applied to cases in which the load current is not permitted under any condition to fall below a guaranteed minimum (higher than the nominal current), i.e. in which the short-circuit current must correspond accurately with a specific value. To limit power dissipation, in fact, the output current depends on the voltage of the transistor (as the transistor voltage increases, i.e. as the load resistance decreases, the output current is reduced to ma maintain the voltage-current product constant).

Moreover, in the case of MOS transistors of considerable size, the above known solutions do not always respond adequately to extremely rapid transient states (rapid short-circuiting) at the load.

It is an object of the present invention to provide a protection circuit capable of responding rapidly, even in the event of rapid overloading, without turning off the power stage.

SUMMARY OF THE INVENTION

According to the present invention, there is provided a power driver circuit with overload protection. The power driver circuit includes a driver circuit for producing a drive current, a load which receives the drive current, and an overload protection circuit for regulating the drive current.

The overload protection circuit includes a slow regulating loop and a fast regulating loop. The slow regulating loop is characterized by relatively low-gain and a high degree of precision and stability. The slow regulating loop accurately controls the maximum current supplied by the driver in the presence of slow overloads or transient states. The fast regulating loop is disposed in parallel with the slow regulating loop, has a relatively high gain, and is generally less stable than the slow regulating loop. The fast regulating loop responds to rapid overloads and brings the driver to a saturated condition in which the slow regulating loop can then effectively maintain the output current at a predetermined rated value.

The present invention also includes a method for protecting a driver circuit from a current overload. The method includes the steps of determining a drive current of the driver circuit, comparing the drive current with a first threshold level and a second threshold level, enabling a first control loop to begin regulation of the drive current when the current exceeds a first threshold level, and enabling a second control loop to begin regulation of the drive current when the current exceeds a second threshold level.

In practice, according to the present invention, the slow regulating loop, being low-gain, is frequency-stable and accurately controls the maximum current supplied by the driver in the presence of slow overloads or transient states. Conversely, in the presence of rapid overloads which cannot be catered to effectively by the slow regulating loop, the fast regulating loop is activated to rapidly discharge the parasitic capacitance of the power transistor. Being unstable, the fast loop results in oscillation of the system but nevertheless brings the power transistor to the saturated condition (linear regulating region) in which the slow regulating loop effectively maintains the output current at the predetermined rated value.

A preferred non-limiting embodiment of the present invention will be described by way of example with reference to the accompanying drawings, in which:

DETAILED DESCRIPTION

Figure 1:
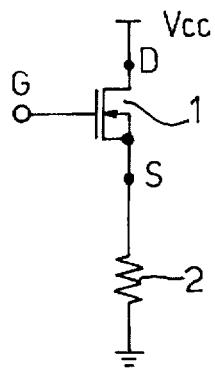
FIG. 1 shows a known power driver to which the present invention is applied.
Figure 2:
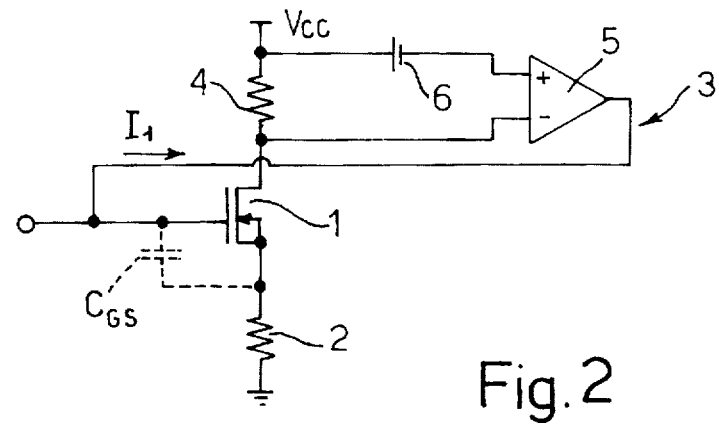
FIG. 2 shows a known protection circuit.
Figure 3:
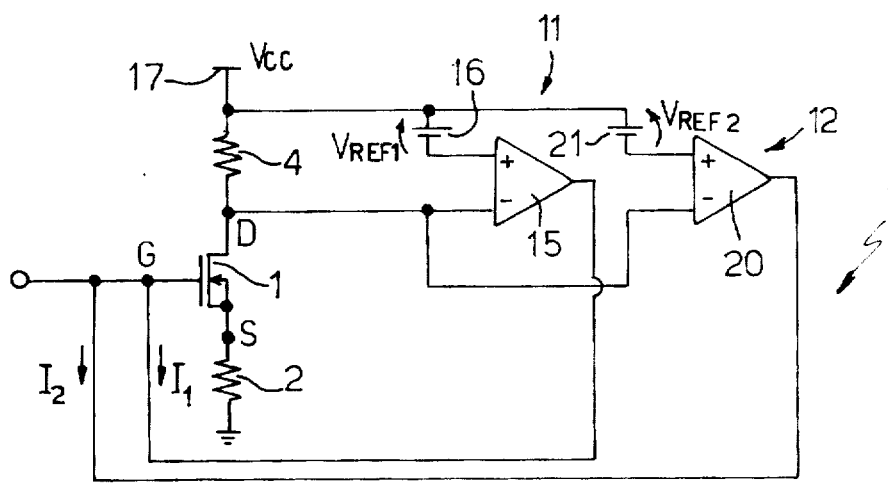
FIG. 3 shows a diagram of the protection circuit according to the present invention.

In FIG. 3, the protection circuit according to the present invention is indicated as a whole by 10, and comprises two parallel current regulating loops 11 and 12.

More specifically, the first (slow) regulating loop 11 provides for ensuring frequency stability and accuracy of the current supply in the event of a short-circuit or overload; presents a low gain; and, as in known solutions, comprises a regulating element 15, the inputs of which are connected to the two terminals of a sensing resistor 4 series connected between $V_{CC}$ supply line 17 and power transistor 1. The intervention threshold of regulating element 15 is represented by a voltage source 16, and the output of regulating element 15 (in the form of an OTA—Operational Transconductance Amplifier i.e. an operational amplifier with an output current $I_1$) is connected to the gate terminal of power transistor 1.

The second (fast) regulating loop 12 presents a very high gain, and hence an output current $I_2$ much higher than $I_1$, and comprises a regulating element formed substantially by a comparator 20, the inputs of which are connected to the two terminals of sensing resistor 4, and the output of which is connected to the gate terminal of power transistor 1. The noninverting input of comparator 20 is connected to the high terminal (connected to line 17) of sensing resistor 4 via a voltage source 21 representing the intervention threshold of regulating loop 12, which is selected higher than the intervention threshold of regulating loop 11 according to the statement:

$$V_{REF1} < V_{REF2}$$

where $V_{REF1}$ and $V_{REF2}$ are the voltages at respectively the positive inputs of amplifiers 15 and 20.

Being high-gain, the second regulating loop is unstable, but does not result in instability of the circuit as a whole, and, far from impairing, provides for ensuring correct operation of protection circuit 10 as explained below.

In the event of a not particularly rapid short-circuit or overload (slow transient state), only first regulating loop 11 is operated, due to its lower intervention threshold. That is, upon the current through sensing resistor 4 exceeding a predetermined value corresponding to voltage $V_{REF1}$, regulating element 15 is operated, which, by means of current $I_1$, reduces the voltage at the gate terminal of power transistor 1, and regulates the operating point of the transistor to prevent an excessive increase in current $I_D$. Being a slow transient state, first regulating loop 11 operates correctly, no oscillation is produced (the first loop is stable), and the voltage at the terminals of sensing resistor 4 at no time exceeds the intervention threshold of second regulating loop 12.

Conversely, in the event of a rapid overload at the output of power transistor 1 (terminal S), output current $I_D$ rapidly exceeds the threshold $V_{REF1}$ of the first regulating loop, which fails to operate effectively, and subsequently also exceeds the second threshold (intervention threshold $V_{REF2}$ of second regulating loop 12). Consequently, second loop 12 is activated, which, presenting a very high gain (high output current $I_2$), rapidly discharges the parasitic capacitance $C_{GS}$ of power transistor 1 (typically in a few μs), thus rapidly reducing the output current $I_D$ of the transistor and so preventing it from being damaged.

Due to the instability, as already stated, of second regulating loop 12, discharge of the parasitic capacitance $C_{GS}$ of power transistor 1 produces an oscillation in turn resulting in a further increase in the output current $I_D$ of the transistor. This increase is detected by first regulating loop 11 which, this time, is in a better condition to operate by virtue of power transistor 1 presenting a discharged gate region and being in the saturation region in which it operates as a current source controlled by voltage $V_{GS}$. In this condition, first regulating loop 11 therefore operates as a linear regulator. Moreover, as the currant, at this point in its increase, is still low, power transistor 1 is in no danger of being damaged despite the slow nature of first regulating loop 11.

In this second phase, first regulating loop 11 therefore operates properly, preventing an excessive increase in the output current $I_D$ of the transistor, and accurately ensuring the regulated current value as well as its own frequency stability, while second regulating loop 12, being below its intervention threshold, remains inactive.

In other words, the faster, unstable second regulating loop 12 operates solely in the event of rapid, high transient states in output current $I_D$, by rapidly discharging the gate capacitance $C_{GS}$ of power transistor 1 and bringing the system into a condition better suited to ensure accurate operation of the first regulating loop.

Figure 4:
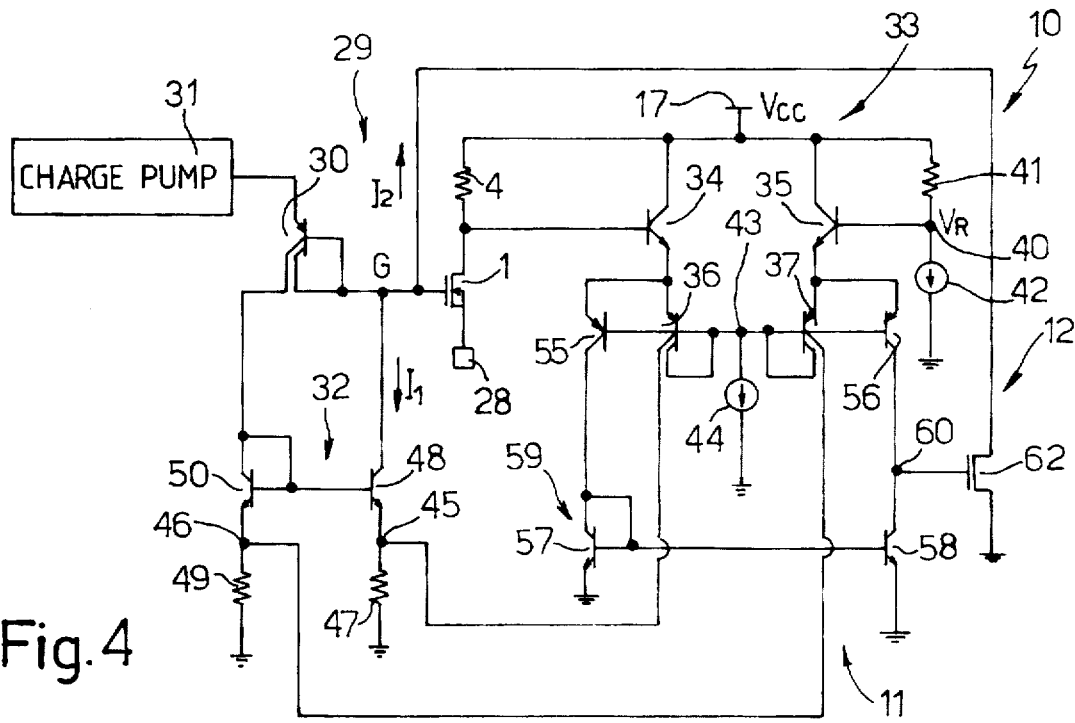
FIG. 4 shows the electric diagram of one embodiment of the protection circuit according to the present invention.

FIG. 4 shows an example embodiment of protection circuit 10 according to the present invention.

As shown in FIG. 4, the gate terminal of power transistor 1 is connected via transistor 30 to a charge pump circuit 31 formed in any known manner and therefore not shown in detail. Power transistor 1, transistor 30 and charge pump circuit 31 (possibly with control elements not shown) together form a driver 29 having an output 28 connected to a load (not shown) supplied with current $I_D$. Transistor 30 is a split-collector PNP transistor with the emitter terminal connected to the output of charge pump 31, the base terminal connected to the gate terminal of power transistor 1, a first collector terminal connected to its own base terminal, and the second collector terminal connected to a current mirror circuit 32 forming part of first regulating loop 11.

First regulating loop 11 substantially comprises a differential stage 33 comprising a first and second NPN type transistor 34, 35, and a third and fourth split-collector PNP type transistor 36, 37. More specifically, transistor 34 presents the collector terminal connected to supply line 17, the base terminal connected to the drain terminal of power transistor 1, and the emitter terminal connected to the emitter terminal of transistor 36. Transistor 35 presents the collector terminal connected to supply line 17, the base terminal connected to a node 40, and the emitter terminal connected to the emitter terminal of transistor 37. Node 40 is set to a fixed voltage representing the threshold voltage of first regulating loop 11, and is connected to one terminal of a resistor 41 (the other terminal of which is connected to supply line 17) and to a current source 42 which therefore determines the voltage $V_R$ at the base terminal of transistor 35.

Transistors 36 and 37 present the base terminals connected to each other at node 43, a first collector terminal short-circuit-connected to the respective base terminal, and a second collector terminal connected to a respective node 45, 46. A bias current source 44 is interposed between node 43 and ground. Node 45 is connected to one terminal of a resistor 47 (the other terminal of which is grounded) and to the emitter terminal of an NPN type transistor 48 forming part of current mirror circuit 32 and presenting the collector terminal connected to the gate terminal of power transistor 1. Node 46 is connected to one terminal of a resistor 49 (the other terminal of which is grounded) and to the emitter terminal of a diode-connected NPN type transistor 50 also forming part of current mirror circuit 32 and presenting the collector terminal connected to the second collector of transistor 30.

Second regulating loop 12 and first regulating loop 11 share the input stage (formed by transistors 34, 35) of differential stage 33, as well as reference voltage source 41, 42. In particular, second loop 12 comprises a first pair of PNP type transistors 55, 56 and a second pair of NPN type transistors 57, 58 forming a current mirror circuit 59. More specifically, transistor 55 presents the emitter terminal connected to the emitter terminal of transistor 34, the base terminal connected to node 43, and the collector terminal connected to the collector terminal of transistor 57. Transistor 56 presents the emitter terminal connected to the emitter terminal of transistor 35, the base terminal connected to node 43, and the collector terminal connected to the collector terminal of transistor 58.

Transistor 57 of current mirror circuit 59 is diode-connected, and presents a grounded emitter terminal and the base terminal connected to the base terminal of transistor 58 which also presents a grounded emitter terminal. Transistors 57 and 58 present an area ratio of 2, so that circuit 59 represents a mirror with a 1:2 ratio, i.e. transistor 58 tends to draw twice the current of transistor 57, to permit regulating loop 12 to operate at a higher threshold than loop 11 despite sharing reference voltage $V_R$, as described in more detail below.

The collector terminal of transistor 58, defining node 60, is connected to the gate terminal of a DMOS transistor 62 having a grounded source terminal and the drain terminal connected to the gate terminal of power transistor 1.

The FIG. 4 circuit operates as follows.

Under normal operating conditions of driver 29, i.e. with a low voltage drop at the terminals of sensing resistor 4, the potential at the base terminal of transistor 34 is greater than the potential $V_R$ at the base terminal of transistor 35, so that transistors 37 and 56 are off, and all the current of bias source 44 is supplied to transistors 36, 55. In known manner, resistor 47 receives the current supplied by transistor 36, and its voltage drop is greater than that (zero) at the terminals of transistor 50, so that transistor 48 is off, current $I_1$ is zero, and the first (slow) regulating loop is off. Similarly, transistor 56 being off, transistor 58 of mirror 59 and DMOS transistor 62 are also off, so that $I_2$ is also zero and the second regulating loop is also off.

As the output current $I_D$ of power transistor 1, and hence the voltage drop at sensing resistor 4, increases, and if the increase is slow, the voltage drop between the base terminals of transistors 34 and 35, in known manner, brings the differential stage to a more balanced position, or even to a position of unbalance towards transistor 35, thus gradually turning on transistor 35, gradually reducing the voltage at resistor 47, and gradually increasing the voltage at resistor 49. When the voltage at resistor 49 exceeds that of resistor 47, transistor 48 comes on and begins conducting current $I_1$, the value of which depends on the unbalance of differential stage 33, so that slow loop 11 accurately regulates output current $I_D$.

At this phase, fast regulating loop 12 is inactive. In fact, in view of the area ratio of transistors 57, 58, transistor 58 remains off until the input stage of differential stage 33 is so unbalanced that the current supplied by transistor 56 is twice that through transistor 55, which unbalance, in the event of a slow transient state of the overload, is prevented by operation of slow regulating loop 11.

As already seen, in the event of a rapid overload at output 28 of driver 29, slow regulating loop 11, even after being turned on, is incapable of preventing a further rapid increase in current $I_D$, which increase therefore results in equally rapid unbalance of the input differential stage and an increase in the current through transistors 56 and 58. Upon the current supplied by transistor 56 exceeding twice the current through transistor 55 (balance point of the fast regulating loop differential stage), the excess current supplied by transistor 56 is supplied to DMOS transistor 62, the gate capacitance of which charges, and DMOS transistor 62 in turn begins conducting and so drawing current $I_2$. In view of the high gain of fast loop 12, said current is high and rapidly discharges the gate region of power transistor 1 to eliminate current $I_D$. As already stated, the instability of fast loop 12 produces an oscillation (inversion of the direction of current $I_2$ and a further increase in current $I_D$) which nevertheless saturates power transistor 1, thus assisting operation of the slow regulating loop which therefore blocks the oscillation and provides for accurately regulating current $I_D$.

The advantages of the circuit described are as follows. In particular, it provides for short-circuit and overload protection without turning off the power stage, so that, upon elimination or termination of the overload condition, the driver continues operating with no external intervention at the inputs required for resetting the circuit.

Moreover, the current regulating loop is frequency-stable by virtue of operation of the fast, unstable, loop being limited to the first phase only.

Following fast intervention of loop 12, the slow regulating loop 11 operates to a high degree of precision, so that, after the very short first phase, the current supplied in the event of an overload is predictable.

The FIG. 4 embodiment provides for reducing the overall size of the circuit by optimizing the layout and sharing a number of elements between the two regulating loops. Moreover, as the two regulating loops share the voltage source defining the intervention threshold of the first loop, and as the threshold of the second loop depends on the emitter area ratio of transistors 57 and 58, the threshold ratio of the two regulating loops is fixed and therefore independent of variations in temperature, supply voltage, reference threshold voltage $V_R$, process spread, or any other interference equally involving the two loops.

The arrangement shown relative to the second regulating loop also provides for extremely rapid intervention: the differential stage defining the intervention threshold drives a DMOS transistor acting directly on the gate of the power device and discharging its low-impedance capacitance.

Clearly, changes may be made to the circuit as described and illustrated herein without, however, departing from the scope of the present invention. In particular, the circuit according to the present invention may also be applied to power transistors other than those described, or to low-side drivers; and the second regulating loop may be implemented in any appropriate manner.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An overload protection circuit for a MOS power driver, the MOS power driver having a control terminal at a control potential and supplied with a drive current, said protection circuit comprising:

a slow regulating loop for measuring an electrical quantity related to said drive current, and for generating a current limiting signal for regulating said control potential; and a fast regulating loop, connected parallel to said slow regulating loop, for detecting rapid variations in said drive current and for generating a rapid control signal for reducing the control potential;

wherein said slow regulating loop has a first gain, a high degree of precision, and is stable; and said fast regulating loop has a second gain which is greater than the first gain.

2. The overload protection circuit in claim 1, wherein said slow regulating loop includes a first enabling means for enabling said slow regulating loop upon said drive current exceeding a first threshold value, and said fast regulating loop includes a second enabling means for enabling said fast regulating loop upon said drive current exceeding a second threshold value higher than the first threshold value.

3. The overload protection circuit in claim 1 wherein said fast regulating loop further includes a current path between said control terminal and a reference potential line, and a power switch located along said current path, for generating a high discharge current for said MOS power driver.

4. The overload protection circuit in claim 2, further comprising:

a measuring element for measuring said electrical quantity, and wherein said slow and said fast regulating loops each include a differential circuit having a first input connected to said measuring element, a second input connected to a respective threshold circuit, and an output connected to said control terminal of said MOS power driver.

5. The overload protection circuit in claim 4, wherein each of said differential circuits of said slow and fast regulating loops has a common input stage connected to a common threshold voltage source, and wherein said differential circuit of said fast regulating loop has a balance point at a higher value of said drive current with respect to said differential circuit of said slow regulating loop.

6. The overload protection circuit in claim 5, wherein said differential circuit of said fast regulating loop further includes a first branch and a second branch connected to said common input stage and to a current mirror circuit with a predetermined area ratio, said current mirror circuit having an output connected to a power switch interposed between said control terminal and a reference potential line.

7. An overload protection circuit for a MOS power driver, the MOS power driver having a control terminal at a control potential and supplied with a drive current, said protection circuit comprising:

a slow regulating loop for measuring an electrical quantity related to said drive current, and for generating a current limiting signal for regulating said control potential; and a fast regulating loop, connected parallel to said slow regulating loop, for detecting rapid variations in said drive current and for generating a rapid control signal for reducing the control potential;

wherein said slow regulating loop includes a first enabling means for enabling said slow regulating loop upon said drive current exceeding a first threshold value, and said fast regulating loop includes a second enabling means for enabling said fast regulating loop upon said drive current exceeding a second threshold value higher than the first threshold value.

8. The overload protection circuit in claim 7, further comprising:

a measuring element for measuring said electric quantity, and wherein said slow and said fast regulating loops each include a differential circuit having a first input connected to said measuring element, a second input connected to a respective threshold circuit, and an output connected to said control terminal of said MOS power driver.

9. The overload protection circuit in claim 8, wherein each of said differential circuits of said slow and fast regulating loops has a common input stage connected to a common threshold voltage source, and wherein said differential circuit of said fast regulating loop has a balance point at a higher value of said drive current with respect to said differential circuit of said slow regulating loop.

10. The overload protection circuit in claim 9, wherein said differential circuit of said fast regulating loop further includes a first branch and a second branch connected to said common input stage and to a current mirror circuit with a predetermined area ratio, said current mirror circuit having an output connected to a power switch interposed between said control terminal and a reference potential line.

11. An overload protection circuit for a MOS power driver the MOS power driver having a control terminal at a control potential and supplied with a drive current said protection circuit comprising:

a slow regulating loop for measuring an electrical quantity related to said drive current, and for generating a current limiting signal for regulating said control potential;

a fast regulating loop, connected parallel to said slow regulating loop, for detecting rapid variations in said drive current and for generating a rapid control signal for reducing the control potential;

a measuring element for measuring said electrical quantity, and wherein said slow and said fast regulating loops each include a differential circuit having a first input connected to said measuring element, a second input connected to a respective threshold circuit, and an output connected to said control terminal of said MOS power driver.

12. The overload protection circuit in claim 11, wherein the measuring element is a resistor.

13. The overload protection circuit in claim 12, wherein each of said differential circuits of said slow and fast regulating loops has a common input stage connected to a common threshold voltage source, and wherein said differential circuit of said fast regulating loop has a balance point at a higher value of said drive current with respect to said differential circuit of said slow regulating loop.

14. The overload protection circuit in claim 13, wherein said differential circuit of said fast regulating loop further includes a first branch and a second branch connected to said common input stage and to a current mirror circuit with a predetermined area ratio, said current mirror circuit having an output connected to a power switch interposed between said control terminal and a reference potential line.

15. The overload protection circuit in claim 1, further comprising:

a measuring element for measuring said electrical quantity, and wherein said slow and said fast regulating loops each include a differential circuit having a first input connected to said measuring element, a second input connected to a respective threshold circuit, and an output connected to said control terminal of said MOS power driver.

16. The overload protection circuit in claim 15, wherein each of said differential circuits of said slow and fast regulating loops has a common input stage connected to a common threshold voltage source, and wherein said differential circuit of said fast regulating loop has a balance point at a higher value of said drive current with respect to said differential circuit of said slow regulating loop.

17. The overload protection circuit in claim 16, wherein said differential circuit of said fast regulating loop further includes a first branch and a second branch connected to said common input stage and to a current mirror circuit with a predetermined area ratio, said current mirror circuit having an output connected to a power switch interposed between said control terminal and a reference potential line.

18. A power driver circuit with overload protection comprising:

a driver circuit for producing a drive current which is controllable by an external means;

a load, connected to said driver circuit, for receiving the drive current; and an overload protection circuit containing a first and a second control loop, each loop determining the drive current, and sending a control signal to the power driver circuit for regulating the drive current;

wherein the first control loop and the second control loop each have a respective gain, a respective stability and a respective precision, the gain of the second control loop being greater than the gain of the first control loop, the stability and precision of the first control loop being greater than those of the second control loop.

19. A power driver circuit with overload protection comprising:

a driver circuit for producing a drive current which is controllable by an external means;

a load, connected to said driver circuit, for receiving the drive current; and an overload protection circuit containing a first and a second control loop, each loop determining the drive current, and sending a control signal to the power driver circuit for regulating the drive current;

wherein the first control loop is enabled when the drive current exceeds a first threshold level, and the second control loop is enabled when the drive current exceeds a second threshold level.

20. The driver circuit of claim 19, wherein the first control loop and the second control loop are connected to a common voltage threshold source for deriving the first and second threshold levels, the second threshold level being a substantially constant multiple of the first threshold level.

21. A method for protecting a driver circuit from a current overload, comprising the steps of:

A) determining a drive current of the driver circuit;

B) comparing the drive current with a first threshold level and a second threshold level;

C) enabling a first control loop to begin regulation of the drive current when the electrical quantity exceeds the first threshold level;

D) enabling a second control loop to begin regulation of the drive current when the electrical quantity exceeds the second threshold level;

wherein the first and second control loops have a respective gain, a respective stability and a respective precision, and wherein the gain of the second control loop is greater than the gain of the first control loop, and the stability and the precision of the first control loop are greater than the stability and the precision of the second control loop.

22. The method for protecting a driver circuit from overload in claim 21, further including the step of providing a common threshold voltage source for providing the first and the second threshold levels and deriving the second threshold level from the common threshold voltage source so that the second threshold voltage is substantially a constant multiple of the first threshold voltage.

23. A method for protecting a driver circuit from a current overload, comprising the steps of:

A) determining a drive current of the driver circuit;

B) comparing the drive current with a first threshold level and a second threshold level;

C) enabling a first control loop to begin regulation of the drive current when the electrical quantity exceeds the first threshold level;

D) enabling a second control loop to begin regulation of the drive current when the electrical quantity exceeds the second threshold level;

E) providing a common threshold voltage source for the first and the second threshold levels and deriving the second threshold level from the voltage source so that the second threshold voltage is substantially a constant multiple of the first threshold voltage.

24. An overload protection circuit for a MOS power driver having a drive current, the circuit comprising:

a first control loop for determining the drive current and for generating a first control signal for regulating the drive current; and;

a second control loop for determining the drive current, and for generating a second control signal for regulating the drive current;

wherein the first and second control loops each have a respective gain, a respective stability and a respective precision, the gain of the second control loop being greater than the gain of the first control loop, the stability and the precision of the first control loop being greater than the stability and the precision of the second control loop.

25. An overload protection circuit for a MOS power driver having a drive current, the circuit comprising:

a first control loop for determining the drive current and for generating a first control signal for regulating the drive current; and;

a second control loop for determining the drive current, and for generating a second control signal for regulating the drive current;

wherein the first control loop is enabled when the drive current exceeds a first threshold level, and the second control loop is enabled when the drive current exceeds a second threshold level.

26. The driver circuit of claim 25, wherein the first and second control loops are connected to a common voltage threshold source for deriving the first and the second threshold levels, the second threshold level being a substantially constant multiple of the first threshold level.

27. A power driver circuit with overload protection comprising:

a driver circuit for producing a drive current which is controllable by external means;

a load, connected to said driver circuit, for receiving the drive current;

a means for determining the drive current, and sending at least one control signal to the power driver circuit for regulating the drive current, said means for determining the drive current including means for responding to fluctuations in the drive current sufficiently quick to prevent damage to the power driver due to excessive drive current;

wherein the means for determining the drive current includes a first control loop and a second control loop, each control loop determining the drive current, and sending a respective control signal to the power driver circuit for regulating the drive current; and wherein the first and second control loops each have a respective gain, a respective stability and a respective precision, the gain of the second control loop being greater than the gain of the first control loop, the stability and the precision of the first control loop being greater than the stability and the precision of the second control loop.

28. The power driver circuit of claim 27, wherein the first control loop is enabled when the drive current exceeds a first threshold level, and the second control loop is enabled when the drive current exceeds a second threshold level.

29. The driver circuit of claim 28, wherein the first and the second control loops are connected to a common voltage threshold source for deriving the first and the second threshold levels, the second threshold level being a substantially constant multiple of the first threshold level.

\* \* \* \* \*